US011545593B2

(12) United States Patent
Lin (10) Patent No.: US 11,545,593 B2
(45) Date of Patent: Jan. 3, 2023

(54) ENCAPSULATION FOR SOLAR CELL AND METHOD FOR ENCAPSULATING SOLAR CELL

(71) Applicant: National Taiwan University, Taipei (TW)

(72) Inventor: Ching-Fuh Lin, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 17/337,007

(22) Filed: Jun. 2, 2021

(65) Prior Publication Data
US 2021/0399158 A1     Dec. 23, 2021

(30) Foreign Application Priority Data

Jun. 20, 2020   (TW) ................................ 109120984

(51) Int. Cl.
*H01L 31/18*   (2006.01)
*H01L 31/048*  (2014.01)
*H01L 31/049*  (2014.01)

(52) U.S. Cl.
CPC ............ *H01L 31/18* (2013.01); *H01L 31/049* (2014.12); *H01L 31/0481* (2013.01)

(58) Field of Classification Search
CPC ............... H01L 31/0481; H01L 31/049; H01L 31/18–1896
See application file for complete search history.

(56) References Cited

U.S. PATENT DOCUMENTS 5,578,141 A  * 11/1996 Mori ................. H01L 31/02366
                                                          136/251
6,184,057 B1 *  2/2001 Van Andel .......... H01L 31/0463
                                                          257/E31.13
2001/0037823 A1* 11/2001 Middelman ......... H01L 31/0392
                                                          257/E27.125

FOREIGN PATENT DOCUMENTS

CN      102714236 A  * 10/2012  ............ C09J 175/04
WO   WO-03075351 A2 *  9/2003  ..... H01L 31/022466

* cited by examiner

*Primary Examiner* — Golam Mowla
(74) *Attorney, Agent, or Firm* — Donald E. Stout; Stout, Uxa & Buyan, LLP (57) ABSTRACT

The subject disclosure provides a simple, fast, and high-yield method for encapsulating solar cells. This method can produce an encapsulation of solar cell(s) that is flat, bubble-free, lightweight, and flexible. In addition, it can also reduce equipment and material costs.

14 Claims, 6 Drawing Sheets

ENCAPSULATION FOR SOLAR CELL AND METHOD FOR ENCAPSULATING SOLAR CELL

CROSS-REFERENCE TO RELATED APPLICATIONS

The entire contents of Taiwan Patent Application No. 109120984, filed on Jun. 20, 2020, from which this application claims priority, are expressly incorporated herein by reference.

BACKGROUND OF THE INVENTION

1. Field of the Invention

The present invention relates to solar cell encapsulations and methods for encapsulating solar cells.

2. Description of Related Art

A traditional encapsulating method for solar cells is to firstly arrange solar cells and film materials in a bottom-up order. Next, the components to be laminated are fed into a large laminator, which is heated and evacuated, and then the components are pressed and laminated. Reference may be made to an encapsulating method for solar elements disclosed in Chinese Patent CN110429151A for related technologies.

The traditional encapsulating method is time-consuming, and the encapsulated solar cell module is heavy. The heating and cooling steps of the encapsulating process take about an hour. After the laminating step, excess materials are subsequently cut off and an aluminum frame for the module is assembled. A general solar cell module contains about 60 solar cells, and the resulted module is about 20 kg and requires two people to carry it.

In order to reduce the weight of the solar cell module, Taiwan Patent 1647862 discloses an encapsulation and a solar cell module, which uses ultra-thin glass or a thin film encapsulation (TFE) polymer to replace a tempered glass of the module. By using lightweight materials, such as ultra-thin glass or organic polymers, e.g., FTFE or polyethylene terephthalate (PET), the weight of solar cell module can be reduced to 10-15 kg. However, the solar cell module is quite heavy and merely suitable for use in power plants on the ground.

In addition, the existing encapsulations for solar cell module typically include a glass plate to protect the solar cells. The glass plate makes the solar cell module inflexible and limits the applications. In order to provide a bendable solar cell module, Chinese Patent Application CN103441169A discloses a solar cell module that includes a plurality of solar cell units electrically connected one another through flexible conductors. Each solar cell unit is provided with a tempered glass sheet and a crystalline silicon cell in a top-down order, and an adhesive film is arranged between the tempered glass sheet and the crystalline silicon cell. However, because the weight of the tempered glass sheet is more than 40% of the weight of individual solar cell units, the subsequent series welded module having inconsistent centers of gravity of individual battery cell units, and hence it is difficult to take the entire module.

In addition, another encapsulation that does not employ a glass sheet is to coat the upper and lower surfaces of the solar cells with epoxy, and two plastic films are attached to the two epoxy layers and a lamination procedure is finally performed. This method requires several hours, and bubbles are easily generated in the encapsulation.

SUMMARY OF THE INVENTION

In some embodiments, the present invention encapsulates a single solar cell in a simple and easy way. In particular, the encapsulation for single solar cell does not include a glass sheet, and the weight of the encapsulation can be reduced by using a composite film with different thickness. And then a module having reduced weight can be obtained by connecting the single solar cell encapsulations in series. The manufactured solar cell encapsulations and module are flexible and bendable, and can be attached to various curved surfaces.

In some embodiments, the encapsulating method provided by the present invention is suitable for encapsulation of solar cells with back electrodes. The output powers of the solar cells with back electrodes are larger than that of general solar cells with H-type electrodes. A front surface of which is the surface on which light is incident, and there are no traditional horizontal finger electrodes and vertical busbar electrodes. The encapsulation can be done without being affected by the topography of the front surface. Two ends of the back surfaces of the solar cells are respectively positive and negative back electrodes, which can be connected in series or parallel to form a solar cell module. Since this type of solar cell is thin (about 150 µm) and has a bendability of about 30 degrees, after the encapsulation it is more flexible and can be attached to various curved surfaces without the risk of cracking. Even if one solar cell is internally cracked due to external force, the surfaces of the solar cells are tightly pulled by the flexible encapsulation, and the generated photocurrent may be diverted to other paths and collected by the back electrodes without affecting the output power of the solar cell module.

In some embodiments, the present invention is directed to an encapsulation for single solar cell, and connection of the encapsulations can form a solar cell module. Accordingly, if one solar cell of the solar cell module has failed, it can be easily replaced.

In some embodiments, the method of the present invention can encapsulate multiple solar cells simultaneously. In particular, areas where need to be connected by solders are first removed from a lower composite film, and then a lamination is performed for the multiple solar cells by a document/photo laminator.

Either one side (light-incident side) or both sides (light-incident side and back side) of one or more solar cells can be encapsulated by method provided by the present invention.

DETAILED DESCRIPTION OF THE PREFERRED EMBODIMENT

Reference will now be made in detail to those specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in detail, it is appreciated that the quantity of the disclosed components may be greater or less than that disclosed, except where expressly restricting the amount of the components. Wherever possible, the same or similar reference numbers are used in drawings and the description to refer to the same or like parts.

The present invention intends to provide lightweight and flexible encapsulations, and simple, fast, high-yield encapsulating methods for solar cell(s). In some embodiments, the disclosed solar cell encapsulations are suitable for drones that are powered by solar energy. For instance, the disclosed solar cell encapsulations could be applied, but are not limited to, drones disclosed in the applicant's previous U.S. patent application Ser. Nos. 15/847,881, 16/167,291, and 16/860,363. The contents of each of the prior applications are hereby incorporated by reference herein in their entirety.

Figure 1:
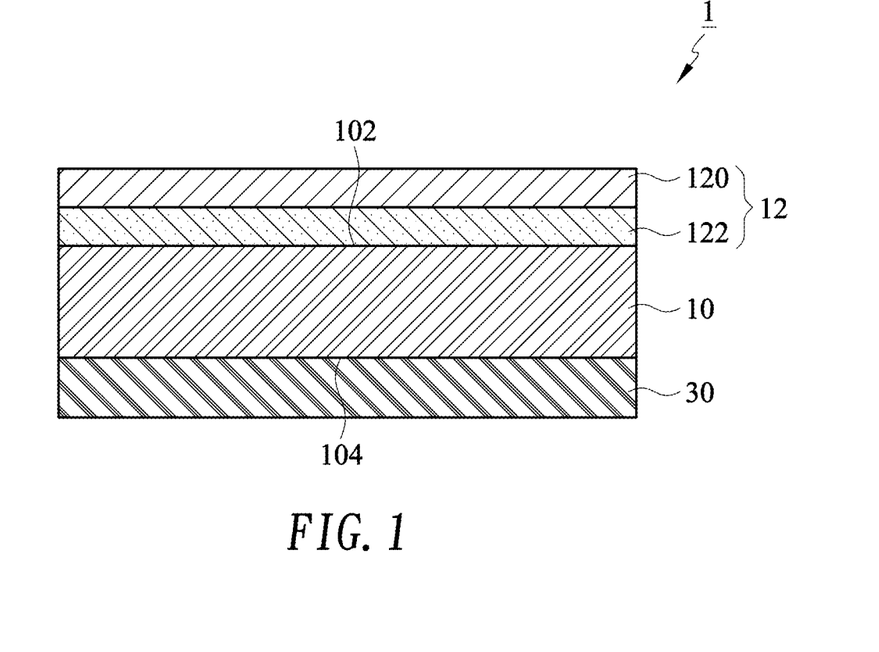
FIG. 1 is a schematic side view of an encapsulation for a solar cell in accordance with a first embodiment of the present invention.

FIG. 1 is a schematic side view of a solar cell encapsulation 1 in accordance with a first embodiment of the present invention. Referring to FIG. 1, the solar cell encapsulation 1 may include a solar cell 10, an upper composite film 12, and a temporary sheet 30. An incident surface 102 of the solar cell 10 facing the upper composite film 12 is the surface through which light enters. Preferably, the solar cell 10 is a solar cell with back electrodes, that is, a back surface 104 of the solar cell 10 includes one or more electrodes (not shown).

Referring to FIG. 1, the upper composite film 12 preferably includes an upper protective layer 120 and an upper adhesive layer 122, wherein the upper adhesive layer 122 is interposed between the upper protective layer 120 and the solar cell 10. The upper protective layer 120 may be made of polyethylene (PE), polypropylene (PP), oriented polypropylene (OPP), polyvinyl chloride (PVC), cast unoriented polypropylene (CPP), biaxially oriented polypropylene (BOPP), or thermoplastic polyester resin (PET).

Referring to FIG. 1, the upper adhesive layer 122 may be made of polyurethane (PU), polyamide (PA), polyethylene (PE), ethylene-vinyl acetate (EVA), or polyvinyl butyral resin (PVB).

Referring to FIG. 1, the temporary sheet 30 may be a piece of paper, polymer, cloth, waterproof paper, or oilpaper.

Figure 2:
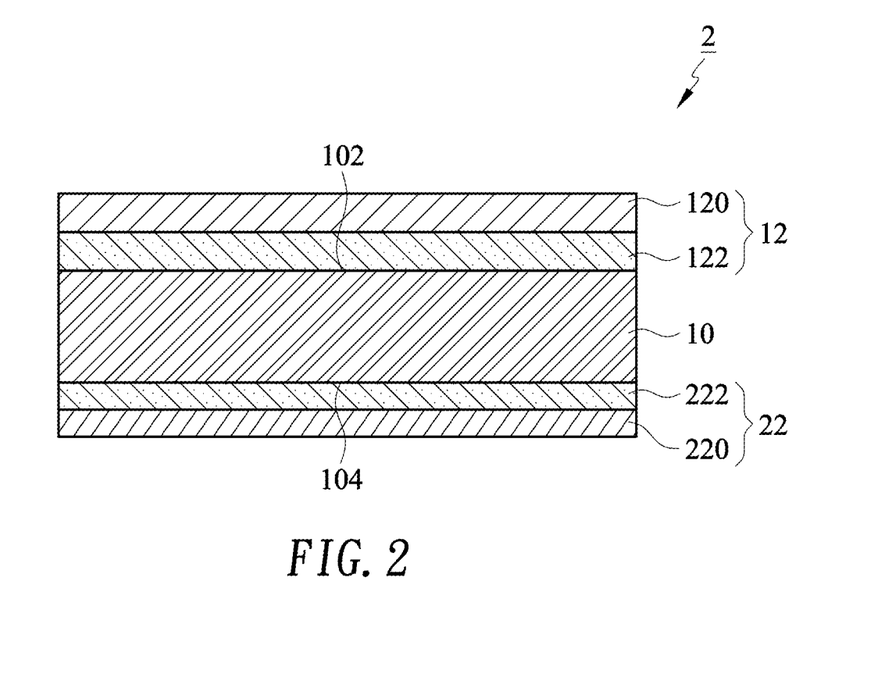
FIG. 2 is a schematic side view of an encapsulation for a solar cell in accordance with a second embodiment of the present invention.

FIG. 2 is a schematic side view of a solar cell encapsulation 2 in accordance with a second embodiment of the present invention. Similar to the solar cell encapsulation 1, the upper composite film 12, which includes the upper protective layer 120 and the upper adhesive layer 122, is disposed on the incident surface 102 of the solar cell 10. The difference is that the solar cell encapsulation 2 further includes a lower composite film 22 disposed on the back surface 104 of the solar cell 10. The lower composite film 22 includes a lower protective layer 220 and a lower adhesive layer 222, and the lower adhesive layer 222 is interposed between the lower protective layer 220 and the solar cell 10.

Referring to FIG. 2, the lower protective layer 220 may be made of polyethylene (PE), polypropylene (PP), oriented polypropylene (OPP), polyvinyl chloride (PVC), cast unoriented polypropylene (CPP), biaxially oriented polypropylene (BOPP), or thermoplastic polyester resin (PET).

Referring to FIG. 2, the lower adhesive layer 222 may be made of polyurethane (PU), polyamide (PA), polyethylene (PE), ethylene-vinyl acetate (EVA), or polyvinyl butyral resin (PVB).

Figure 3:
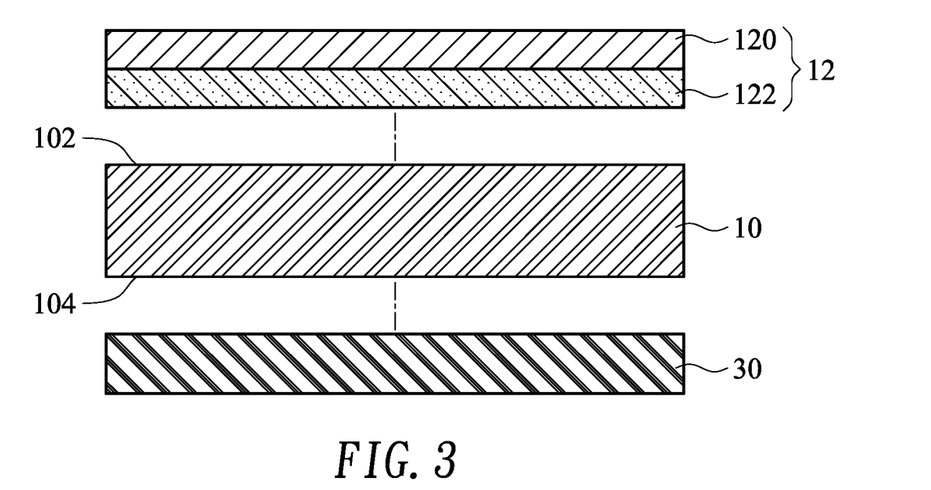
FIG. 3 is a schematic diagram of a method for encapsulating a solar cell in accordance with a third embodiment of the present invention.

FIG. 3 is a schematic diagram showing a method for encapsulating a solar cell in accordance with a third embodiment of the present invention. This method can make the solar cell encapsulation 1 as shown in FIG. 1. Referring to FIG. 3, firstly, the aforementioned single solar cell 10 and the upper composite film 12 are placed on the temporary sheet 30 in a bottom-up order. Notice should be made that in the preferred embodiment, the upper protective layer 120 and the upper adhesive layer 122 are pre-bonded to form the upper composite film 12. The adhesive layer 122 is solid and non-adhesive at room temperature. The temporary sheet 30 can be repeatedly used. In this embodiment, the temporary sheet 30 is a piece of paper. In some embodiments, the temporary sheet 30 does not need to be removed after the lamination and becomes part of the encapsulation.

Next, the aligned temporary sheet 30, the single solar cell 10, and the upper composite film 12 are laminated with a document/photo laminator (not shown). Lamination is carried out at atmospheric pressure without the need for evacuation. Preferably, the document/photo laminator includes a temperature-adjustment mechanism, such as (but is not limited to) one or more infrared lamps, which can adjust the laminating temperature. Depending on the thickness of the upper composite film 12, the lamination is performed with a suitable laminating temperature. In some embodiments, the laminating temperature ranges from 120° C. to 200° C. In some embodiments, the laminating temperature ranges from 130° C. to 160° C., and this range are suitable for most of the upper composite films 12.

Figure 4:
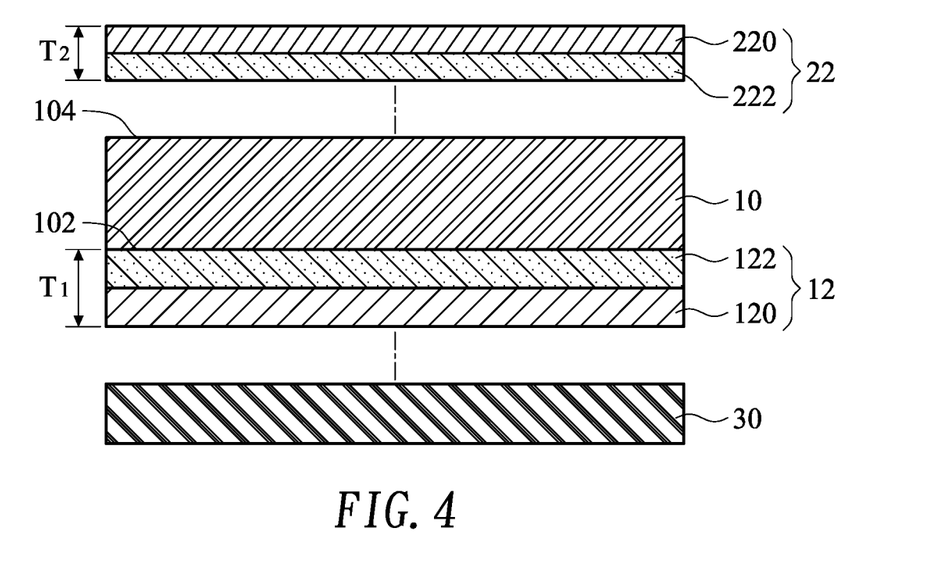
FIG. 4 is a schematic diagram of a method for encapsulating a solar cell in accordance with a fourth embodiment of the present invention.

FIG. 4 is a schematic diagram showing a method for encapsulating a solar cell in accordance with a fourth embodiment of the present invention. This method can form the solar cell encapsulation 2 of FIG. 2.

Figure 5:
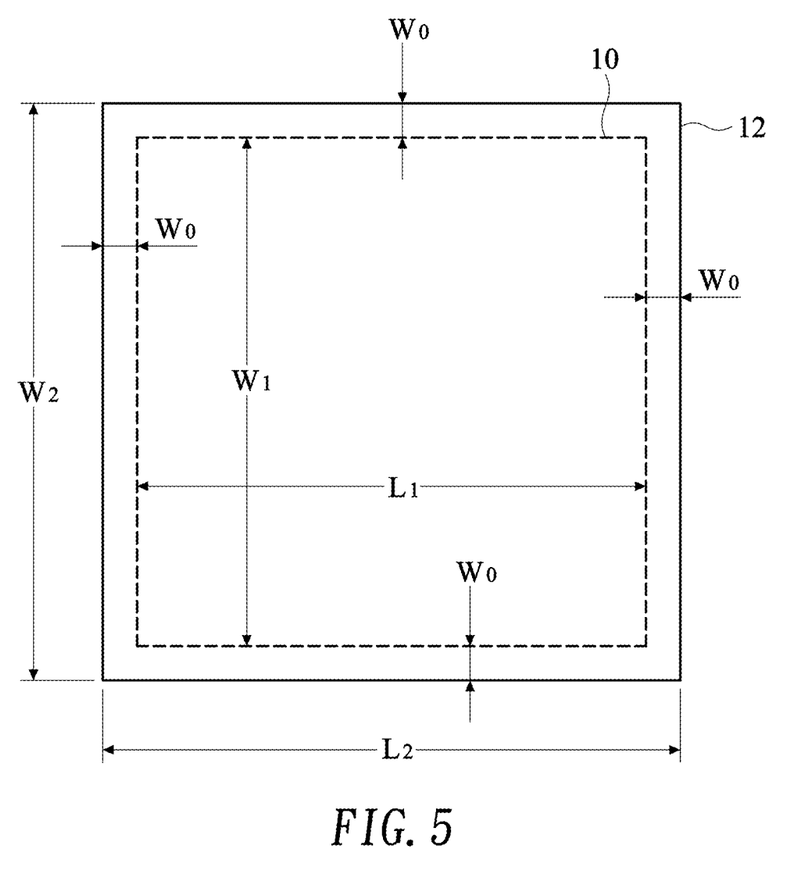
FIG. 5 is a top view after encapsulating an upper composite film on a single solar cell.

Referring to FIG. 4, in a preferred embodiment, a single-sided encapsulation is first performed. Firstly, after a first lamination according to the method of FIG. 3, an upper composite film 12 is formed on a single solar cell 10. FIG. 5 is a top view showing that the upper composite film 12 is formed on the single solar cell 10. As shown in FIG. 5, in one embodiment after the upper composite film 12 is formed on a single solar cell 10, edges of the upper composite film 12 are cut. Taking a rectangular or square solar cell 10 as an example, after cutting, the length $L_1$ of the solar cell 10 is less than the length $L_2$ of the upper composite film 12, and the width $W_1$ of the solar cell 10 is less than the width $W_2$ of the upper composite film 12. That is, the boundary of the upper composite film 12 protrudes a distance $W_0$ from the boundary of the solar cell 10. In some embodiments, $W_0$ is between 0.2 mm and 1.5 mm. In another embodiment, the upper composite film 12 is pre-cut, and after the solar cell 10 and the upper composite film 12 are laminated, the boundary of the upper composite film 12 protrudes a distance $W_0$ from the boundary of the solar cell 10.

Next, referring to FIG. 4, the laminated upper composite film 12 and the solar cell 10 are placed on the temporary sheet 30 with the upper composite film 12 facing the temporary sheet 30. Here, the temporary sheet 30, such as a piece of paper, may be the one previously used for the first lamination, or may be replaced with a new temporary sheet 30. Next, the lower composite film 22 is placed on the back surface 104 of the solar cell 10. In a preferred embodiment, the lower protective layer 220 and the lower adhesive layer 222 are pre-bonded to form the lower composite film 22.

Next, referring to FIG. 4, depending on to the thickness of the lower composite film 22, a second lamination is performed with a suitable second laminating temperature. In some embodiments, the second laminating temperature ranges from 120° C. to 200° C. In some embodiments, the second laminating temperature ranges from 130° C. to 160° C., and this range are suitable for most of the lower composite films 22. Preferably, the second lamination is carried out at atmospheric pressure without evacuation. After the second lamination, the temporary sheet 30 is removed. Preferably, before the second lamination, regions of the lower composite film 22 corresponding to electrodes (not shown) of the solar cell 10 have been removed. In another embodiment, this removal step is performed after the second lamination.

Referring to FIG. 4, the thickness T1 of the upper composite film 12 is greater than the thickness T2 of the lower composite film 22. Experimental results show that by controlling the distance $W_0$, the thicknesses of the upper composite film 12 and the lower composite film 22, and/or the temperatures of the first and second laminations, a flat encapsulation can be formed with no bubbles being formed between the upper composite film 12 and the solar cell 10 and no bubbles being formed between the lower composite film 22 and the solar cell 10.

In the embodiments of FIGS. 1-4, the thicknesses of the upper composite film 12 and the lower composite film 22 are between 30 μm and 300 μm. In some embodiments, the thickness of the upper composite film 12 is between 40 μm and 200 μm, and the thickness of the lower composite film 22 is between 25 μm and 80 μm. In some embodiments, the thickness of the upper composite film 12 is between 50 μm and 120 μm, and the thickness of the lower composite film 22 is between 30 μm and 50 μm. In some applications of the solar cell encapsulation such as being used in drones, the thicknesses of the upper composite film 12 and the lower composite film 22 are required to be thin; otherwise the weight requirements for the solar cell module will not be satisfied.

Figure 6:
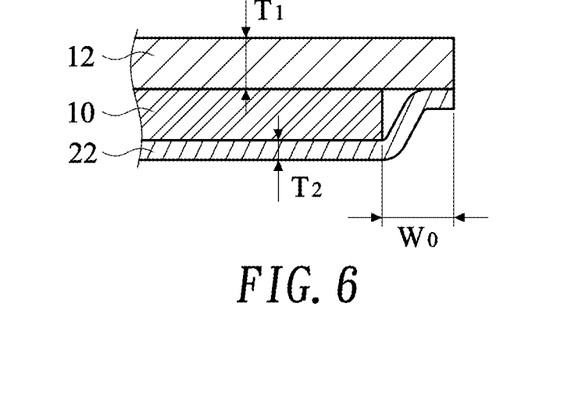
FIG. 6 is a schematic diagram showing an edge of a solar cell encapsulation made by method of FIG. 4.

FIG. 6 is a schematic diagram showing an edge of the encapsulation after the second lamination is made according to the method of FIG. 4. As shown in FIG. 6, in the preferred embodiment, the thickness T1 of the upper composite film 12 is greater than the thickness T2 of the lower composite film 22. Accordingly, when performing the second encapsulation, edge portions of the lower composite film 22 can be compressed flexibly, such that it can bond to the upper composite film 12 over a distance $W_0$ from the boundary of the solar cell 10, and hence form an integrated seal to protect the solar cell 10.

Figure 7:
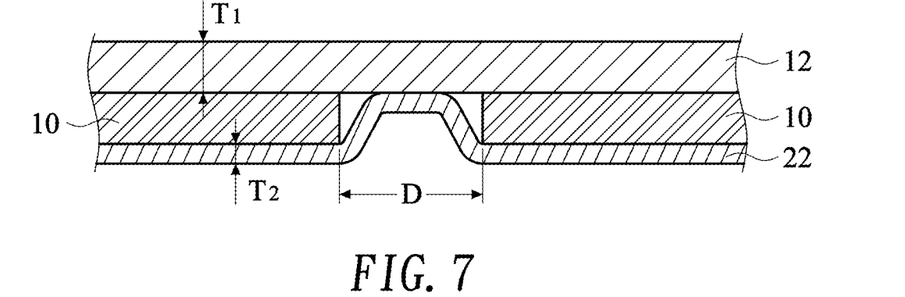
FIG. 7 is a schematic diagram showing an encapsulation and method for solar cells in accordance with a fifth embodiment of the present invention.

The methods shown in FIGS. 3 and 4 can also be used to encapsulate multiple solar cells 10 at the same time. In some embodiments, the single solar cell 10 of FIGS. 3 and 4 is replaced with multiple solar cells 10. FIG. 7 is a schematic diagram showing an encapsulation and a method for multiple solar cells in accordance with a fifth embodiment of the present invention. In this embodiment, the thickness T1 of the upper composite film 12 is greater than the thickness T2 of the lower composite film 22, and after the second lamination, a gap D between two adjacent solar cells is greater than T1 and approximately equal to twice the aforementioned $W_0$, that is, D is between 0.4 mm and 3.0 mm.

Figure 9A:
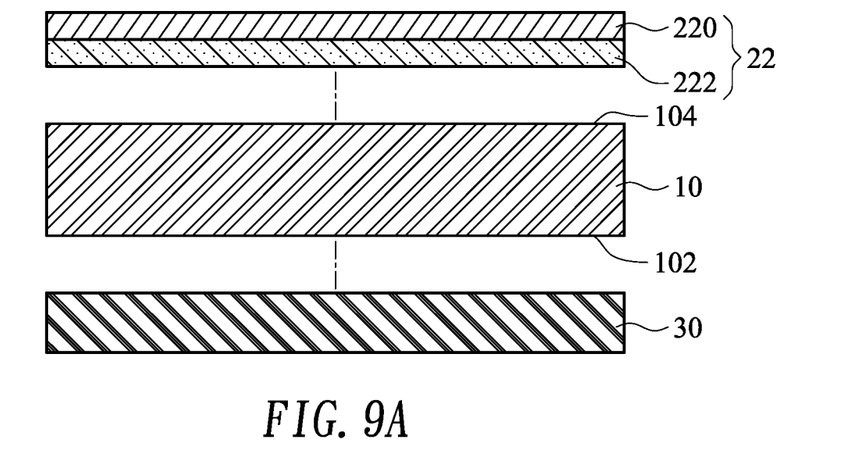
FIGS. 9A and 9B are schematic diagrams showing an encapsulation and method for solar cells in accordance with a sixth embodiment of the present invention.
Figure 9B:
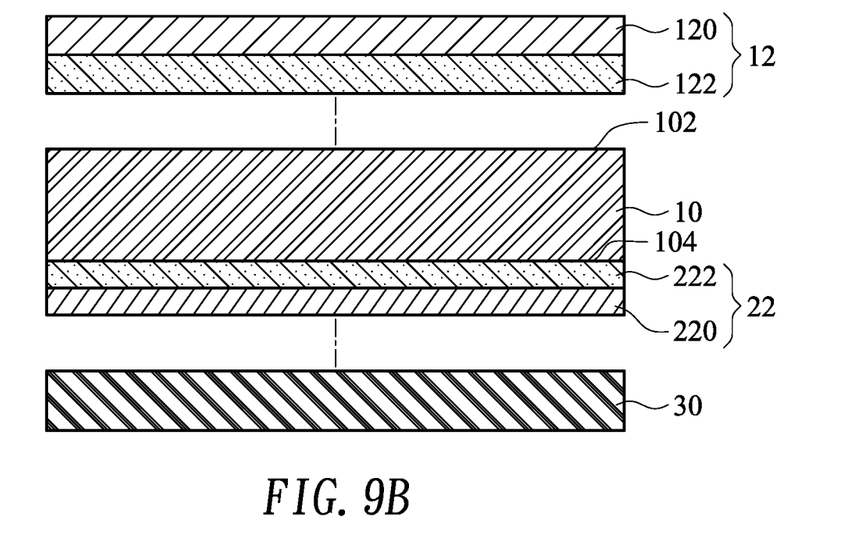

FIGS. 9A and 9B are schematic diagrams showing an encapsulation and method for solar cells in accordance with a sixth embodiment of the present invention. Similar to the method shown in FIG. 4, this example can be used for double-sided encapsulation of one or more solar cells 10. The difference is that, in this embodiment, the first lamination is performed to encapsulate the lower composite film 22, and then the second lamination is performed to encapsulate the upper composite film 12. The detail is as follows. Referring to FIG. 9A, firstly, a solar cell 10 is disposed on a temporary sheet 30, where the incident surface 102 of the solar cell 10 faces the temporary sheet 30. After that, a lower composite film 22 is placed on the back surface 104 of the solar cell 10. The lower composite film 22 includes a lower protective layer 220 and a lower adhesive layer 222, and the lower adhesive layer 222 is located between the lower protective layer 220 and the solar cell 10. A first lamination is performed at atmospheric pressure and a first laminating temperature. The temporary sheet 30 is removed after the first lamination. Referring to FIG. 9B, after that, the solar cell 10 and the lower composite film 22 are placed on the temporary sheet 30, where the lower composite film 22 faces the temporary sheet 30. An upper composite film 12, which includes an upper protective layer 120 and an upper adhesive layer 122, is then placed on the incident surface 102. The adhesive layer 122 is located between the upper protective layer 122 and the solar cell 10. Then a second lamination is performed at atmospheric pressure and a second lamination temperature. Preferably, the thickness of the upper composite film 12 is greater than the thickness of the lower composite film 22. After the first lamination, the lower composite film 22 protrudes a distance $W_0$ from the boundary of the solar cell 10. Other details of this embodiment may be the same as the embodiment of FIG. 4.

Figure 8:
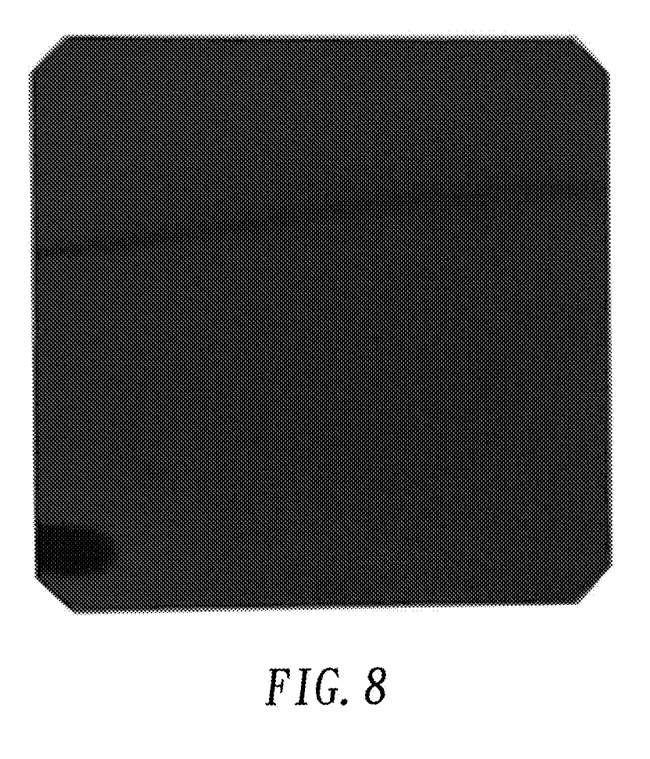
FIG. 8 is a photograph of a solar cell encapsulation made by the fourth embodiment of the present invention.

FIG. 8 is a photograph showing a solar cell encapsulation 2 formed by the method of FIG. 4. As shown in FIG. 8, the exemplary method of the present invention can provide a flat and light-weight solar cell encapsulation 2 without bubbles formed therein. In this embodiment, the weight of the 5-inch solar cell 10 is about 8 g. In some embodiments, after the second lamination, the weight of the 5-inch solar cell encapsulation 2 is increased by between 0.6 g and 2.0 g compared to the weight of the solar cell 10. Alternatively, the weight increase ratio is between 10% and 35% by weight of the solar cell 10. In some embodiments, a weight/area ratio of the solar cell encapsulation 2 is less than or equal to 0.06 g/cm$^2$.

Instead of using a high-temperature evacuated large-scale laminator, the methods of the present invention employ a document/photo laminator for the encapsulation. The equipment cost can be reduced and there are a variety of commercially available document/photo laminators to choose from. Moreover, the laminating procedure by using the document/photo laminator is simple and fast.

In the methods and encapsulations according to the embodiments of the present invention, one or two composite films are used to replace heavy and fragile glass. In some embodiments, the upper composite film and the lower composite film may be commercially available laminating sheets. Depending on the weight requirement for the solar cell encapsulation, one or two commercially available laminating sheets with suitable thicknesses are selected. The material cost can be reduced, and there are a variety of commercially available laminating sheets to choose from.

According to the methods of the present invention, a flat, lightweight, and bubble-free solar cell encapsulation, which is suitable for applications such as drones having extreme requirements on weight, can be obtained.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention. Corresponding or related structure and methods disclosed or referenced herein, and/or in any and all co-pending, abandoned or patented application(s) by any of the named inventor(s) or assignee(s) of this application and invention, are incorporated herein by reference in their entireties, wherein such incorporation includes corresponding or related structure (and modifications thereof) which may be, in whole or in part, (i) operable and/or constructed with, (ii) modified by one skilled in the art to be operable and/or constructed with, and/or (iii) implemented/made/used with or in combination with, any part(s) of the present invention according to this disclosure, that of the application and references cited therein, and the knowledge and judgment of one skilled in the art.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

All of the contents of the preceding documents are incorporated herein by reference in their entireties. Although the disclosure herein refers to certain illustrated embodiments, it is to be understood that these embodiments have been presented by way of example rather than limitation. For example, any of the particulars or features set out or referenced herein, or other features, including method steps and techniques, may be used with any other structure(s) and process described or referenced herein, in whole or in part, in any combination or permutation as a non-equivalent, separate, non-interchangeable aspect of this invention. Corresponding or related structure and methods specifically contemplated and disclosed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the inventive concepts set forth herein and parts thereof, in any permutation and/or combination, include the subject matter of any one or more of the mentioned features and aspects, in any permutation and/or combination.

Although specific embodiments have been illustrated and described, it will be appreciated by those skilled in the art that various modifications may be made without departing from the scope of the present invention, which is intended to be limited solely by the appended claims.

What is claimed is:

1. A method for encapsulating at least one solar cell, comprising:
    providing a temporary sheet;
    placing at least one solar cell on the temporary sheet, the at least one solar cell having an incident surface and a back surface, the back surface being opposite to the incident surface and facing the temporary sheet;
    placing an upper composite film on the incident surface, the upper composite film having an upper protective layer and an upper adhesive layer, the upper adhesive layer being located between the upper protective layer and the at least one solar cell;
    performing a first lamination for the temporary sheet, the at least one solar cell, and the upper composite film under atmospheric pressure and a first laminating temperature;
    removing the temporary sheet;
    placing the at least one solar cell and the upper composite film on the temporary sheet after the first lamination, wherein the upper composite film faces the temporary sheet;
    placing a lower composite film having a lower protective layer and a lower adhesive layer on the back surface, the lower adhesive layer being located between the lower protective layer and the at least one solar cell; and
    performing a second lamination for the temporary sheet, the upper composite film, the at least one solar cell, and the lower composite film under atmospheric pressure and a second laminating temperature.

2. The method as recited in claim 1, wherein the first lamination is performed by a document/photo laminator.

3. The method as recited in claim 1, wherein the upper composite film is a pre-bonded film formed by the upper protective layer and the upper adhesive layer before the first lamination.

4. The method as recited in claim 1, wherein the second lamination is performed by a document/photo laminator, and the lower composite film is a pre-bonded film formed by the lower protective layer and the lower adhesive layer before the second lamination.

5. The method as recited in claim 1, wherein the thickness of the upper composite film is greater than the thickness of the lower composite film.

6. The method as recited in claim 1, wherein after the first lamination the upper composite film is cut so that a boundary of the upper composite film protrudes a distance $W_0$ from the boundary of the at least one solar cell, and the distance $W_0$ is between 0.2 mm and 1.5 mm.

7. The method as recited in claim 1, wherein the upper protective layer and the lower protective layer are made of polyethylene (PE), polypropylene (PP), oriented polypropylene (OPP), polyvinyl chloride (PVC), cast unoriented polypropylene (CPP), biaxially oriented polypropylene (BOPP), or thermoplastic polyester resin (PET).

8. The method as recited in claim 1, wherein the upper adhesive layer and the lower adhesive layer are made of polyurethane (PU), polyamide (PA), polyethylene (PE), ethylene-vinyl acetate (EVA), or polyvinyl butyral resin (PVB).

9. The method as recited in claim 1, wherein the thickness of the upper composite film is between 50 μm and 200 μm, and the thickness of the lower composite film is between 25 μm and 80 μm.

10. The method as recited in claim 1, wherein the temporary sheet is a piece of paper, cloth, or polymer.

11. The method as recited in claim 1, wherein the at least one solar cell is a plurality of solar cells, and a distance between every two of the plurality of solar cells is between 0.4 mm and 3.0 mm.

12. The method as recited in claim 11, wherein the distance between every two of the plurality of solar cells is greater than the thickness of the upper composite film, and the thickness of the upper composite film is greater than the thickness of the lower composite film.

13. A method for encapsulating at least one solar cell, comprising:
   providing a temporary sheet;
   placing at least one solar cell on the temporary sheet, the at least one solar cell having an incident surface and a back surface, the incident surface being opposite to the back surface and facing the temporary sheet;
   placing a lower composite film on the back surface, the lower composite film having a lower protective layer and a lower adhesive layer, the lower adhesive layer being located between the lower protective layer and the at least one solar cell;
   performing a first lamination for the temporary sheet, the at least one solar cell, and the lower composite film under atmospheric pressure and a first laminating temperature;
   removing the temporary sheet;
   placing the at least one solar cell and the lower composite film on the temporary sheet after the first lamination, wherein the lower composite film faces the temporary sheet;
   placing an upper composite film on the incident surface, the upper composite film having an upper protective layer and an upper adhesive layer, the upper adhesive layer being located between the upper protective layer and the at least one solar cell; and
   performing a second lamination for the temporary sheet, the upper composite film, the at least one solar cell, and the lower composite film under atmospheric pressure and a second laminating temperature.

14. The method as recited in claim 13, wherein the thickness of the upper composite film is greater than the thickness of the lower composite film.

* * * * *